United States Patent [19]

Johns

[11] 4,352,137

[45] Sep. 28, 1982

[54] METHODS AND APPARATUS FOR FAULT DETECTION

[75] Inventor: Allan T. Johns, Corsham, England

[73] Assignee: The General Electric Company Limited, London, England

[21] Appl. No.: 237,867

[22] Filed: Feb. 25, 1981

[30] Foreign Application Priority Data

Mar. 1, 1980 [GB] United Kingdom ............... 8007051

[51] Int. Cl.³ ............................................. H02H 3/18
[52] U.S. Cl. ...................................... 361/82; 324/52; 361/84
[58] Field of Search ...................... 361/66, 67, 68, 69, 361/79, 80, 81, 82, 84; 307/358; 324/51, 52

[56] References Cited

U.S. PATENT DOCUMENTS

| | | | |
|---|---|---|---|
| 3,524,075 | 8/1970 | Matthews et al. | 307/358 X |
| 3,931,502 | 1/1976 | Kohlas | 361/80 X |
| 3,983,456 | 9/1976 | Suzuki | 361/68 X |
| 4,128,805 | 12/1978 | Lanz | 361/80 X |
| 4,234,901 | 11/1980 | Strickland, Jr. | 361/68 X |
| 4,251,766 | 2/1981 | Souillard | 325/52 |

Primary Examiner—Reinhard J. Eisenzopf
Attorney, Agent, or Firm—Kirschstein, Kirschstein, Ottinger & Cobrin

[57] ABSTRACT

This invention relates to methods and apparatus for detecting the occurrence of a fault on a conductor or transmission line and for protecting the conductor or line in accordance with the determination of fault. The instantaneous value of the voltage (V) and current (i), or the modal components of that voltage and current in the case of a polyphase line, are formed into two functions $S_{1R}$ and $S_{2R}$, which are of the general form $V\dot{E}iR$ and $V\dot{U}iR$ respectively where R is a replica of the surge impedance of the line. Superimposed components of these functions are derived by continuously subtracting the steady-state value of each function from its instantaneous value. The sequence in which the functions obtain a value outside a predetermined band of values is monitored to provide an indication of the existence and direction of a fault with respect to the measuring point. Trip and block signals are generated for operating circuit breakers.

16 Claims, 16 Drawing Figures

METHODS AND APPARATUS FOR FAULT DETECTION

This invention relates to methods and apparatus for detecting the occurrence of direction of a fault in an electrical conductor and methods and apparatus for protecting networks of such conductors in the event of a fault. The invention is particularly, but not exclusively, suitable for use with power supply systems.

Conventionally fault detection on power lines has been performed by monitoring the impedance of the transmission line. However impedance measurement is only meaningful in relation to steady-state sinusoidal conditions, so that, it becomes increasingly difficult to perform an accurate and discriminative measurement as the amount of post fault information used is reduced. Thus impedance devices are subject to errors of measurement encountered during high-resistance earth faults and power swings and due to the low apparent frequency of aperiodic components in the measurands associated with faults in long-line applications.

It is an object of the invention to provide a method of fault detection which overcomes, at least to some extent, some or all of the above mentioned problems and which provides, at least in certain forms, high speed fault indication. The invention also provides fault detection apparatus.

From a first aspect the invention consists in a method of detecting the occurrence of a fault on an electrical conductor carrying an electrical signal, in which characteristics of the electrical signal on the conductor are sensed and monitored or processed to provide an indication of a fault.

From a second aspect the invention consists of apparatus for detecting the occurrence of a fault on an electrical conductor designed to carry an electrical signal, comprising means for sensing the electrical characteristics of the signal and means for monitoring or processing the sensed characteristics to provide an indication of a fault.

Preferably, in either case, two electrical characteristics may be sensed, in which case the values of the combinations may be monitored to determine the location of the fault. Preferably the combinations are the sum and difference, respectively, and the characteristics are the current and voltage on the conductor.

Alternatively the instantaneous values of the two characteristics may be sensed and first and second functions formed therefrom, any variation of either function from a selected value being sensed to provide an indication of the direction of fault. The selected value may be approximately zero, the steady-state value or a small finite value or band of values. The direction of fault may be determined by detecting the sequence in which functions vary from the selected value.

In a preferred embodiment the two functions correspond respectively to the sum and the difference of the two electrical characteristics. In particular the electrical characteristics may be the voltage and the current and the first and second functions, $S_{1R}$ and $S_{2R}$ respectively, may be formed as follows:

$$S_{1R} = K_1 v_f(t) - K_2 R i_R(t)$$

$$S_{2R} = K_3 v_f(t) + K_4 R i_R(t)$$

where $v_f(t)$ is a signal proportional to the difference between the steady-state voltage on the conductor and the instantaneous voltage;

$R i_R(t)$ is a signal proportional to the product of the difference between the steady-state current and the instantaneous current and the constant (R) which is preferably related to the surge impedance of the conductor; and each of $K_1$, $K_2$, $K_3$ and $K_4$ is a positive or negative constant.

The method and apparatus may be used to detect faults on a polyphase transmission line by forming and using modal components of the electrical characteristics. Preferably modal components are derived and processed or monitored for each individual conductor to provide a fault indication or to determine the location of the fault.

A method of protecting an electrical circuit including a conductor, may be provided, including the steps of detecting the occurrence of direction of a fault or the direction of a fault on the conductor using any of the above methods and operating switching apparatus to protect the circuit and/or clear the conductor, in dependance on the determination of fault. The invention also consists in apparatus for performing such a method.

In a preferred form the method and apparatus of the invention set out in the preceding paragraphs are such that a fault is detected in less than 4 ms and/or the line is cleared, protected or isolated in less than one cycle of the electrical signal.

Where a fault is detected by judging the sequence in which combinations or functions vary from a selected value a protect instruction or an inhibit instruction may be generated depending on which function or combination is the first to vary from the selected value.

From a further aspect the invention consists of apparatus comprising a power line in a power line system, a fault detector at each termination of the line, each fault detector being arranged such that if a fault occurs in a direction looking into the line the fault is detected as occurring in one direction and if a fault occurs in a direction looking away from the line the fault is detected as occurring in the other direction and decision means for determining whether to isolate, protect or clear the line in accordance with the detected directions and for activating the switching apparatus in accordance with that decision.

The power line may be a T-feeder or other multiple ended feeder in which case the apparatus may operate when there are fault detectors only at the terminations of the feeder. In either of these last two cases the decision means may only activate the switching apparatus when all of the fault detectors detect a fault in the one direction.

From a still further aspect the invention may consist in a method and/or apparatus for creating a superimposed value of an electrical characteristic of a signal or the signal itself by subtracting the steady-state value of the characteristic or signal from the instantaneous value.

From another aspect the invention consists in apparatus for obtaining the superimposed component of an electrical signal or a function thereof, comprising a signal input for receiving the instantaneous value of the signal or its function, subtracting means having first and second inputs, the signal input being connected to the first and second inputs, and delay means disposed in the connection between the signal input and the first input the arrangement being such that the instantaneous value of a signal or function is subtracted from a corresponding but earlier part of the signal or function.

The method or apparatus set out above may be used in obtaining the functions or combinations of the two electrical characteristics.

The term modal components broadly refers to computed combinations of voltage or current or other electrical characteristics of a signal on a polyphase transmission line which are uncoupled and can be mathematically treated as if the signal is being propagated down a single electrical conductor and in particular refers to any combination of the instantaneous voltage or instantaneous current on each conductor of a polyphase transmission line, which effectively possesses wave propagation characteristics which are independent of each other to the extent of being, for practical purposes, uncoupled and possessing associated definable surge impedance and wave velocities at any arbitary frequency.

The following are a list of the principal symbols used in the following description.

$v_s(t), v_f(t)$ = time variation of steady-state and superimposed component voltages.

$i_s(t), i_f(t)$ = time variation of steady-state and superimposed component currents.

$Z_0$ = surge impedance $c$ = velocity of propagation $h(t)$ = unit step function $L, C$ = inductance and capacitance per unit length of line.

$l$ = line length $t$ = time after fault $s_1, s_2$ = relaying signals $T_{FR}$ = time taken for disturbance within system R to propagate to point R.

$x_F, y_F$ = distance to fault.

$R_0$ = surge replica impedance $f_0$ = nominal system frequency $V_s$ = setting voltage of comparator $R_F$ = fault resistance $Z_{S0}, Z_{S1}$ = zero and positive sequence generating source impedance at power frequency.

s.c.1. = short circuit level.

Subscripts

R,S,F = ends R, S and fault point F.

a,b,c = phases a, b and c.

1,2,3 = modal components 1, 2, 3.

i,r = incident and reflected components.

The invention may be performed in a number of ways specific embodiments of which will now be described, by way of example, with reference to the following drawings in which.

——= total superimposed voltage at R, $v_{fR}(t) = v_{fF}(t) = h(t)V_m \sin w_o t$.

---= initial superimposed current, $v_{fF}(t)/Z_o$.

- - - - - = total reflected superimposed current at R at time $2l/c$, $v_{fF}(t-2l/c)/Z_o$.

. . . . . = total superimposed current in line at R, $i_{fR}(t) = v_{fF}(t)/Z_o + v_{fF}(t-2l/c)/Z_o$.

Figure 3A:
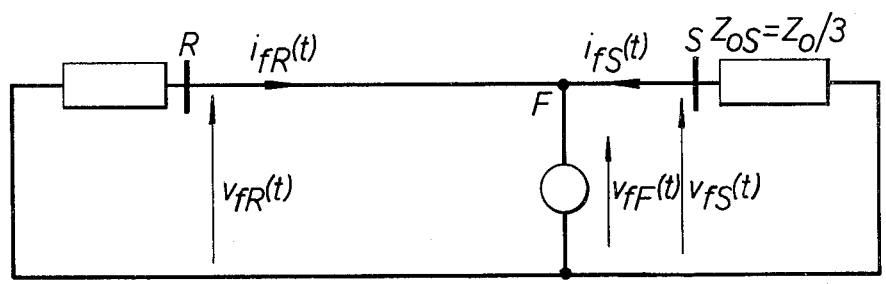
Figure 3B:
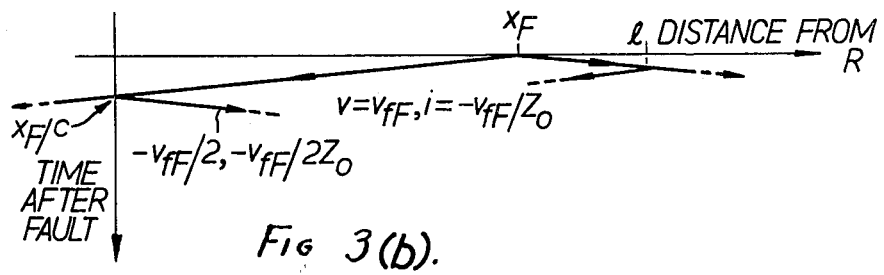
Figure 3C:
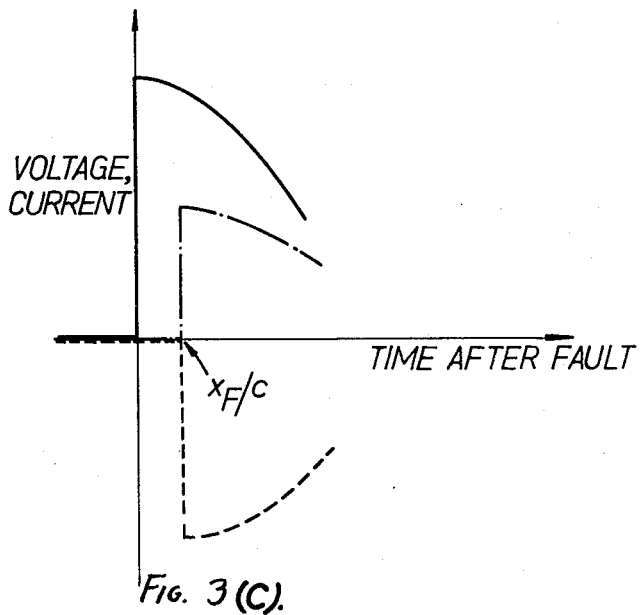

FIG. 3(a) illustrates the initial propagation of superimposed quantities following fault in forward direction, by means of a superimposed fault circuit;

FIG. 3(b) illustrates the same by means of a lattice diagram;

FIG. 3(c) illustrates the same by time variation of superimposed quantities consistent with a fault at negative peak of prefault voltage.

where:

——= superimposed fault-point voltage, $v_{fF}(t)$.

---= superimposed voltage at R, $v_{fR}(t) = v_{fF}(t-x_F/c)/2$.

- - - - - = superimposed current at R, $i_{fR}(t) = -3v_{fF}(t-x_F/c)/2Z_o$.

Figure 4A:
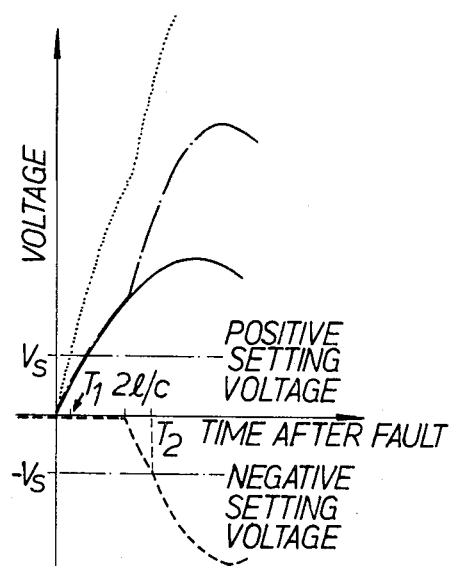
Figure 4B:
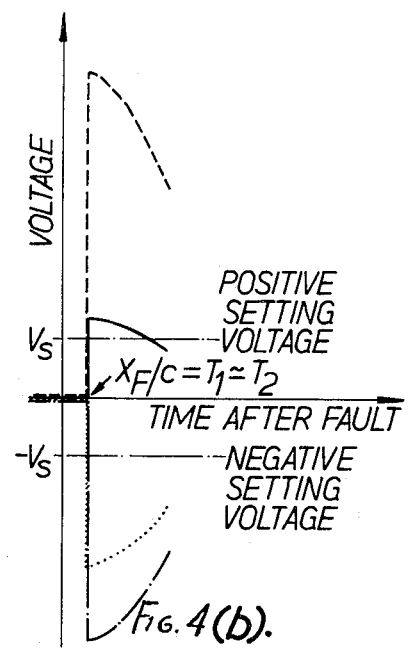

FIG. 4(a) shows the variation of relaying signals at R following faults on a simple system in the event of a reverse fault at R;

FIG. 4(b) shows the same in the event of a fault on line R-S;

where:

——= $v_{fR}(t)$

---= $R_o i_{fR}(t)$

- - - - - = $s_{1R} = v_{fR}(t) - R_o i_{fR}(t)$

. . . . . = $s_{2R} = v_{fR}(t) + R_o i_{fR}(t)$

Figure 5:
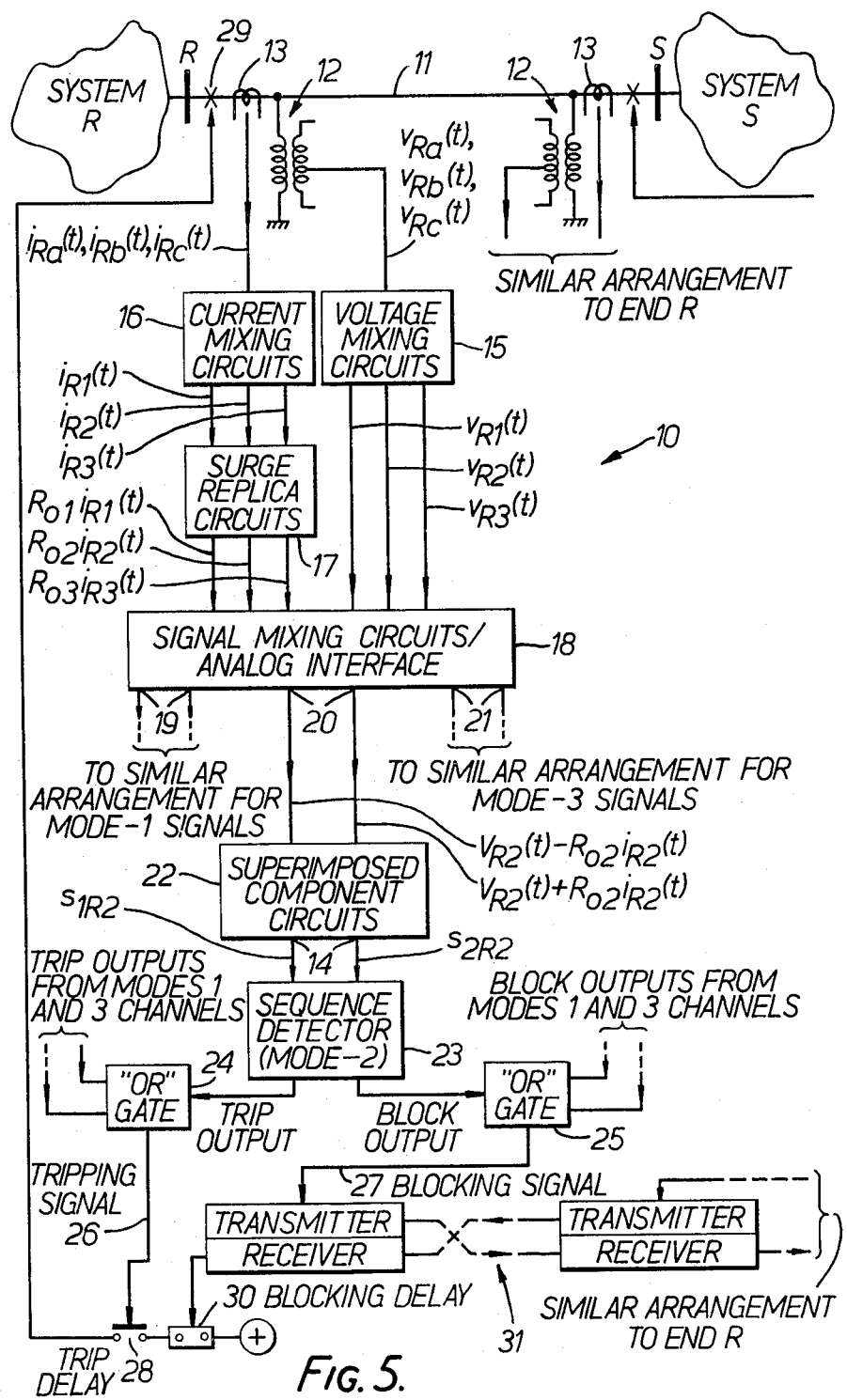

FIG. 5 is block schematic of a u.h.s. power line protection system.

Figure 6A:
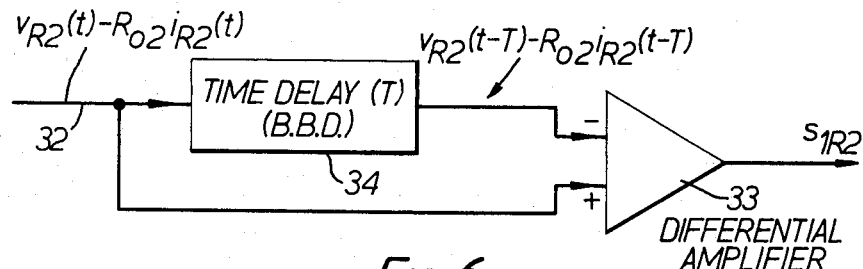

FIG. 6a is a circuit arrangement for creating superimposed components; and

Figure 6B:
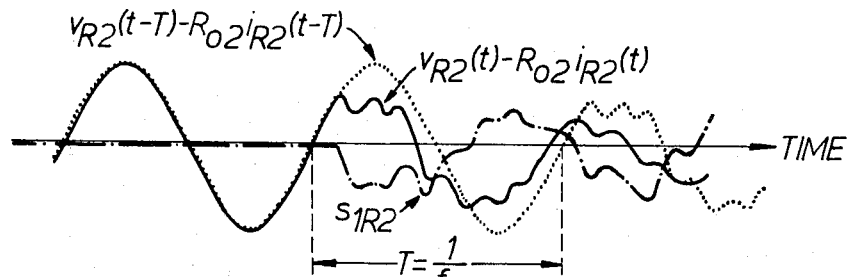

FIG. 6b shows waveforms illustrating the circuits action.

Figure 7:
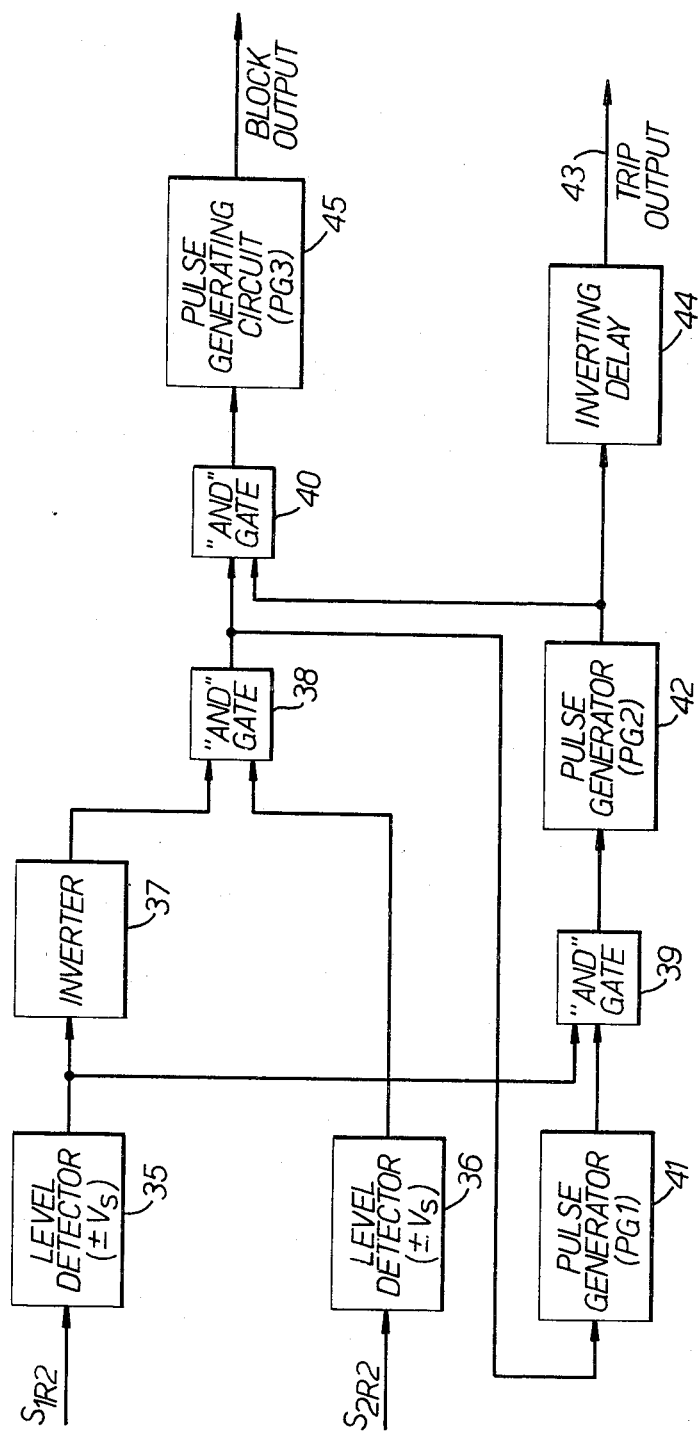

FIG. 7 is a block circuit diagram of a sequence detector.

Figure 8:
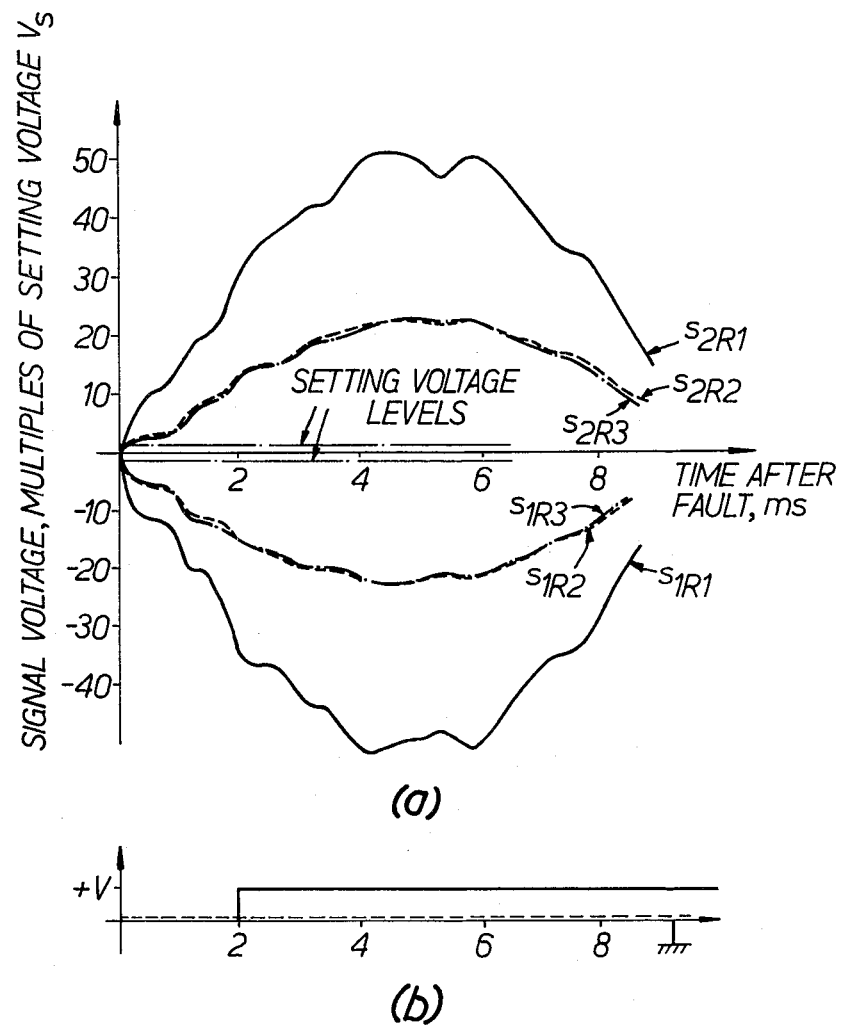

FIG. 8 shows the initial variation of relaying signals and output of relay at R following close-up "a"-earth fault.

$R_F = 0$; fault at peak prefault "a"-earth voltage; $x_F = 0$.

(a) show the relaying signals;

(b) show the relay output, ——, = tripping signal, - - - = blocking signal.

Figure 9:
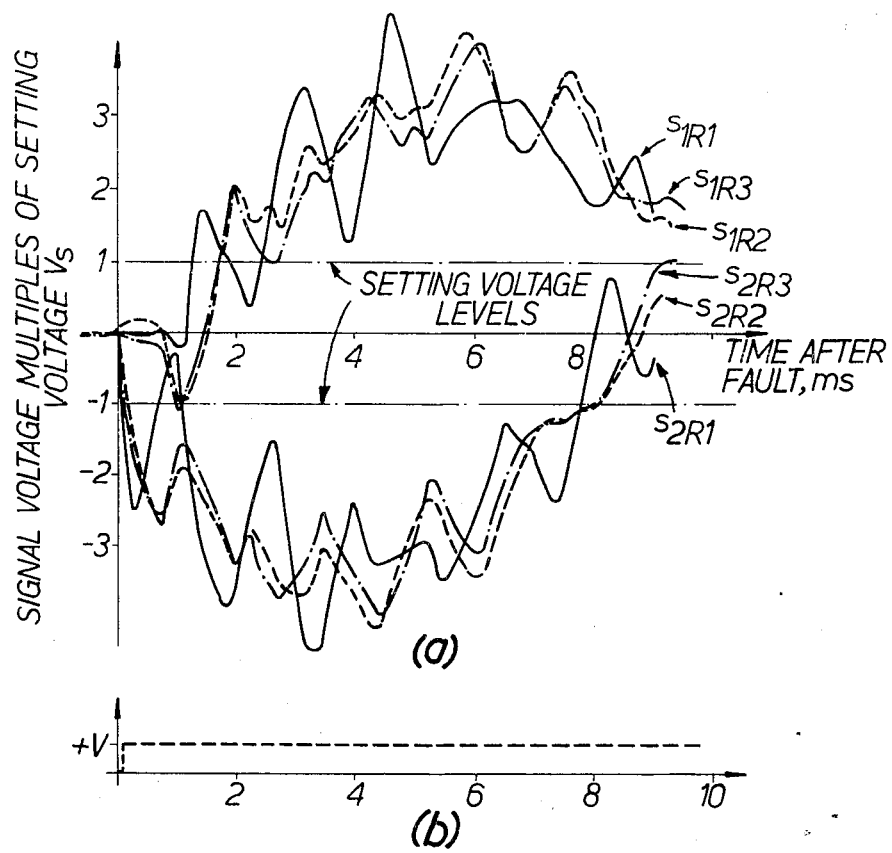

FIG. 9 shows the initial variation of relaying signals and output of relay at R following reverse "a"-earth fault, where:

$R_F = 0$; fault at peak prefault "a"-earth voltage; $y_F = 0$.

(a) show the relaying signals (b) show the relay output, ——= tripping signal, - - - = blocking signal.

Figure 10:
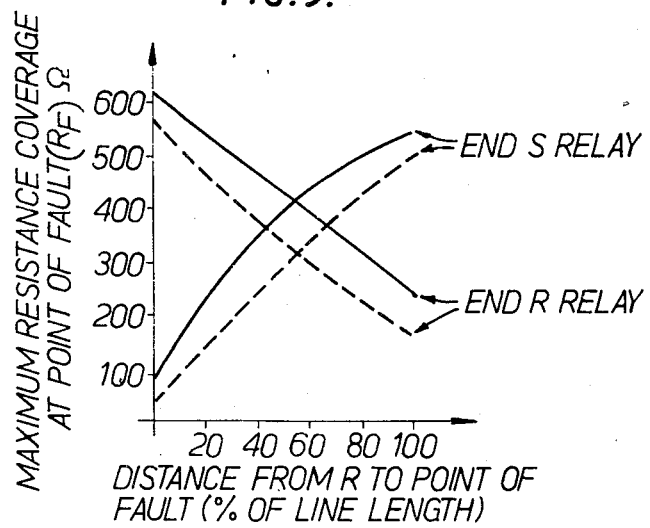

FIG. 10 illustrates performance of relays for high resistance "a"-earth fault by showing variation of maximum fault resistance coverage with fault position, where:

——= fault at peak of prefault voltage to earth

- - - - - = fault at zero prefault voltage to earth.

The transient stability of electric power systems is amongst other things dependent on fault clearance times and it is therefore desirable to reduce the clearance times to a minimum. The overall fault clearance times depend on the operating time of the protection scheme and, equally importantly, on the speed of the circuit breakers. A considerable amount of work has been done on reducing breaker operating times to the order of one cycle of power frequency and it seems likely that, in the future, any further reduction in overall fault clearance times will depend heavily on the emergence of new ultra high speed (u.h.s.) protection techniques. Furthermore, in cases where only a limited reduction of fault clearance times is sought, the use of faster protection as opposed to faster circuit breakers can represent a particularly attractive solution from an economic point of view.

The new travelling-wave type u.h.s. directional detector described hereafter, may be used with any interconnection of a communication channel but for the purposes of the description it is described in conjunction with a carrier blocking type communication channel. In this detector a determination of the direction to a fault is made by comparing the variation of the modal components of the voltages and currents which are caused to be superimposed upon the steady-state prefault power frequency components following the occurrence of a fault.

The basis of the new method of u.h.s. directional detection is best explained by reference to a simple single phase line interconnection R-S shown in FIG. 1. Directional detectors are situated at points R and S and the reference directions of the voltage and current at the relaying point R are as indicated.

The total voltage and current at R can be considered as consisting of two components. Components $v_{sR}(t)$ and $i_{sR}(t)$ are sinusoidal and are equal to the steady-state prefault voltages and current respectively. The occurrence of a fault is equivalent to suddenly superimposing a voltage at the point of fault which is equal and opposite to the prefault steady-state fault point voltage. It follows that the superimposed components $v_{fR}(t)$, $i_{fR}(t)$ which are observed at R, can be considered as those voltages and currents which would arise if the superimposed fault point voltage were applied to the system with all source voltages set at zero.

It is evident that the superimposed components can be considered as existing in their own right in an otherwise de-energised circuit and that they effectively propagate according to the characteristics of the system configuration concerned. The device described below effectively uses only the superimposed components of voltage and current at the relaying point. Details of the methods by which the superimposed quantities are extracted from the total variation of $v_R(t)$, $i_R(t)$ will be considered, but for present purposes it will be assumed that the superimposed quantities are available. However, it is worth emphasizing at this stage that under normal unfaulted essentially steady-state conditions, the superimposed components are zero.

Figure 1:
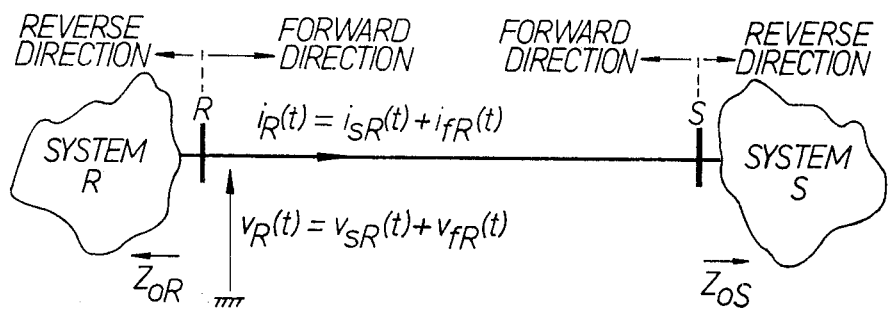
FIG. 1 is a diagram showing simple line interconnection.

With reference to FIG. 1, it is useful to consider how the superimposed quantities $v_{fR}(t)$, $i_{fR}(t)$ are related following a fault immediately behind the relay location at R. If it is assumed that the line is lossless, the surge impedance and the wave propagation velocity take the familiar form defined in equations 1 and 2.

$$Z_o = \sqrt{L/C} \qquad (1)$$

$$c = 1/\sqrt{LC} \simeq 3.10^8 m/s \qquad (2)$$

Because the fault point coincides with the relaying point, the resulting superimposed voltage $v_{fR}(t)$ can be considered as a suddenly applied voltage waveform at R which propagates towards end S at the velocity defined in eqn (2). The associated superimposed current wave $i_{fR}(t)$ also propagates at a velocity c and, because lossless transmission is assumed, is initially linearly related to $v_{fR}(t)$ by the real value of surge impedance $Z_o$ as given in eqn (3).

$$v_{fR}(t) = Z_o i_{fR}(t) \qquad (3)$$

Point S is a point of impedance discontinuity from which a proportion of the incident superimposed voltage and current waves are reflected back towards the relaying point R. The precise proportion of the incident wave reflected depends on the reflection coefficient at S.

If the surge impedance looking into system S is defined by $Z_{oS}$ then the ratio of reflected to incident superimposed components at S will be given by $(Z_{oS}-Z_o)/(Z_{oS}+Z_o)$ and $(Z_o-Z_{oS})/(Z_{oS}+Z_o)$ for voltage and current components respectively.

Figure 2A:
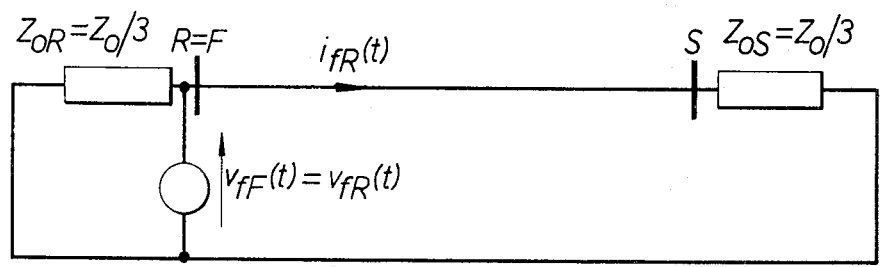
FIG. 2(a) illustrates the initial propagation of superimposed quantities following fault behind R by means of a superimposed fault circuit.
Figure 2B:
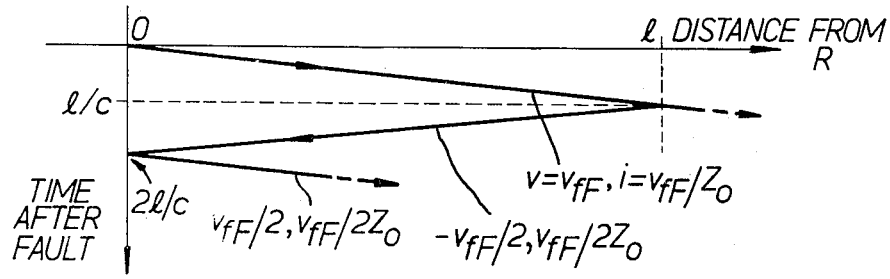
FIG. 2(b) illustrates the same by means of a lattice diagram.
Figure 2C:
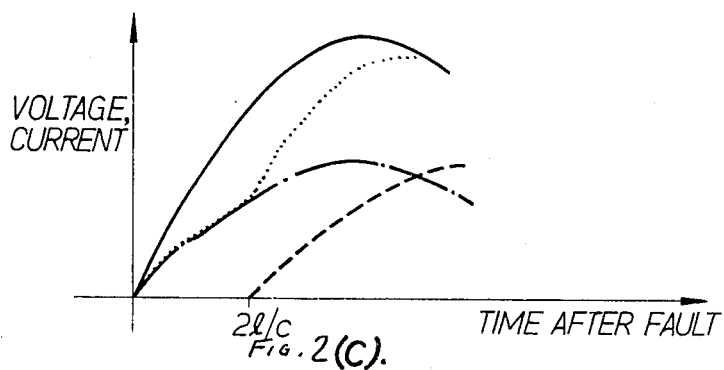
FIG. 2(c) illustrates the same by means of time variation of superimposed quantities consistent with a fault at positive to negative zero-crossing of prefault voltage. where.

FIG. 2 illustrates the behaviour of an assumed lossless system in respect of the superimposed components which propagate following a reverse fault where $Z_{oR}=Z_{oS}=Z_o/3$. These termination conditions are exactly analogous to a situation in which each sub-station terminates four lines of equal surge impedance $Z_o$. FIG. 2b shows the lattice diagram of the superimposed voltages and currents at any point on the line and FIG. 2c shows the resulting superimposed components $v_{fR}(t)$, $i_{fR}(t)$ at the relaying point R. It is particularly important to note that for all time up to the time at which the fault occurs, both $v_{fR}(t)$ and $i_{fR}(t)$ are zero. Furthermore, although the waveforms of FIG. 2c are consistent with a fault at zero voltage point on the wave, the relationship of eqn 3 also holds for all time from fault inception up to twice the wave transit time 2l/c for any arbitrary fault point superimposed voltage waveform $v_{fR}(t)$. This latter fact is also true for any value of terminating surge impedances ($Z_{oR}$, $Z_{oS}$) and line attenuation. For example, if the source surge impedance at end S were exactly equal to that of the line, there would be no reflection from S, but the difference $v_{fR}(t)-Z_o i_{fR}(t)$ is still zero for all time $t < 2l/c$. The effect of a non-real value of line surge impedance as observed in real systems will be evident from below.

The foregoing observations apply also for faults within system R. In this case however there is a time delay between fault inception and the arrival of the superimposed components at the measuring point. Nevertheless, the difference $v_{fR}(t)-Z_o i_{fR}(t)$ is still zero for all time 2l/c after the arrival of the superimposed quantities at R. The added delay in the measurement process is however of little significance because the directional detector is designed to restrain for reverse faults.

FIG. 3 illustrates the behaviour of the superimposed quantities following a fault on a line which is again assumed terminated in surge impedances such that $Z_{oR}=Z_{oS}=Z_o/3$. It is evident from the lattice diagram and waveforms of FIGS. 3b and 3c respectively that initially the travelling-waves of superimposed voltage and current are of opposite polarity. Unlike reverse faults therefore, the difference $v_{fR}(t)-Z_o i_{fR}(t)$ becomes immediately finite or non-zero on arrival of the superimposed waves at a time $x_F/c$ after fault inception. This conclusion holds good for faults anywhere on the line or within system S, and it will later be shown to be also true for any effective terminating surge impedances $Z_{oR}$, $Z_{oS}$. In the case of a fault at end S of the line, there is a delay of l/c seconds between fault inception and the arrival of the superimposed quantities at R. This is the maximum delay between fault inception and the commencement of the measurement process for which fault clearance is desired. In the case of faults within S, there is a larger measuring delay involved but this is of no significance because the scheme is designed to restrain for such a condition. Although the waveforms illustrated in FIG. 3c are consistent with a fault at peak prefault voltage, the conclusions drawn equally apply for any other arbitrary superimposed fault point voltage waveform $v_{fF}(t)$.

The new u.h.s. directional detector makes use of two signals proportional to the superimposed voltage and current components. In terms of primary system values, the signals utilised in the detector at R are as given in eqn (4).

$$s_{1R} = v_{fR}(t) - R_o i_{fR}(t)$$

$$s_{2R} = v_{fR}(t) + R_o i_{fR}(t) \qquad (4)$$

The corresponding signals used in the detector at S, which has the reference directions in FIG. 3, are defined in eqn (5).

$$s_{1S} = v_{fS}(t) - R_o i_{fS}(t)$$

$$s_{2S} = v_{fS}(t) + R_o i_{fS}(t) \qquad (5)$$

The replica resistance $R_o$ is arranged to match the line surge impedance $Z_o$. For an ideal lossless line, $Z_o$ is of course real and a perfect match is possible.

It will be recalled that, for reverse faults, the difference $v_{fR}(t) - Z_o i_{fR}(t) = 0$ for all time up to $2l/c$ after the arrival of superimposed waves at R. Therefore, assuming a lossless line and perfect matching of the replica resistance $R_o$, the relaying signals defined in eqn (4) are, for all time, $0 \leq t \leq T_{FR} + 2l/c$ given by eqn (6).

$$s_{1R} = 0$$

$$s_{2R} = 2v_{fR}(t) \qquad (6)$$

The important point to note is that $s_{2R}$ becomes finite before $s_{1R}$. This is clearly evident from FIG. 4a which shows how the signals vary following the reverse fault condition at $R(T_{FR} = 0)$ on the previously considered simple system arrangement shown in FIG. 2. The sequence in which the signals $s_{1R}$, $s_{2R}$ rise above a given threshold value ($s_{2R}$ followed by $s_{1R}$) at times $T_1 < T_2$ is clearly evident.

It has been shown above that, following a forward fault, the difference $v_{fR}(t) - Z_o i_{fR}(t)$ becomes immediately finite on arrival of the superimposed components at R. In particular, it can be shown that, following a fault at a distance of $x_f$ and assuming perfect matching of the replica resistance $R_o$ to the surge impedance $Z_o$, the signals initially rise from zero according to the relationships given in eqn (7).

$$s_{1R} = 2v_{fF}(t - x_F/c)$$

$$s_{2R} = 2v_{fF}(t - x_F/c)(Z_{oR} - Z_o)/(Z_{oR} + Z_o) \qquad (7)$$

The most important feature of the immediate post-fault variation in $s_{1R}$, $s_{2R}$ described by eqn (7) is that the magnitude of signal $s_{2R}$ is always less than or equal to that of $s_{1R}$. In this respect there are two cases where it is theoretically possible for the signals to be exactly equal in magnitude. The first is where $Z_{oR}$ is identically zero, ie, a perfect infinite busbar source exists at end R. The second more practically obtainable situation is one where the circuit breakers on all incoming circuits behind R are open, and in consequence $$Z_{oR} \rightarrow \infty.$$

It follows from the foregoing considerations that, for forward faults, signals $s_{1R}$, $s_{2R}$ can simultaneously exceed a given setting or pick-up level or, more commonly in practice, $s_{1R}$ rises above setting before signal $s_{2R}$. FIG. 4b serves to illustrate the manner in which the signals behave following the forward fault condition on the previously considered system shown in FIG. 3. In this case the setting levels are exceeded almost simultaneously ($T_1 \simeq T_2$) due to the very rapid change in the superimposed components associated with the assumed fault at peak prefault voltage.

The sequence in which $s_{1R}$, $s_{2R}$ exceed giving setting levels forms the basis on which the direction to a fault is determined. Similar principles are invoked to likewise provide u.h.s. directional detection at end S by using the signals given in eqn (5).

The principles developed above were by reference to an idealized loss-free single-phase line. Even if line losses are neglected, it is not possible in a 3-phase multiconductor line to define a single value of surge impedance. Direct implementation of the new technique using, for example, the line currents and phase-to-earth voltages would not be entirely satisfactory for all fault conditions. The techniques used to overcome the foregoing problems involves decomposing the phase variations of the currents and voltages into modal components, each of which have fixed propagation characteristics.

Because the modal components are independent of one another, and effectively exist in their own right, the earlier analysis equally applies when considering the variation of composite signals utilising superimposed modal voltages and currents. In this respect it is important to note that the relative levels of the superimposed modal voltages which follow a fault are heavily dependent on the type of fault involved and also upon the point on wave at which the fault occurs. For example, a pure interphase fault clear of earth produces a negligible earth mode component whereas, some faults involving two phases and earth can produce very low levels of mode 2 or 3. It is therefore highly desirable to employ a separate channel of comparison for each of the three modes, the forms of the signals used at the R end of a line being defined in eqns (16), (17) and (18) for mode 1, 2 and 3 components respectively.

$$s_{1R1} = v_{fR1}(t) - R_{o1} i_{fR1}(t)$$

$$s_{2R1} = v_{fR1}(t) + R_{o1} i_{fR1}(t) \qquad (16)$$

$$s_{1R2} = v_{fR2}(t) - R_{o2} i_{fR2}(t)$$

$$s_{2R2} = v_{fR2}(t) + R_{o2} i_{fR2}(t) \qquad (17)$$

$$s_{1R3} = v_{fR3}(t) - R_{o3} i_{fR3}(t)$$

$$s_{2R3} = v_{fR3}(t) + R_{o3} i_{fR3}(t) \qquad (18)$$

The sequence check previously applied to each of the three signal pairs and a trip or block signal is initiated by the operation of the first channel to complete the directional determination. In this way, it is possible to ensure satisfactory operation following faults which give rise to an insufficient level of one or even two of the modal input measurands.

It will be appreciated that perfect matching of the replica surge impedances $R_{o1}$, $R_{o2}$, $R_{o3}$ to the corresponding surge impedances is impossible because the line losses cause $Z_{o1}$, $Z_{o2}$, $Z_{o3}$ to have specific complex values peculiar only to given frequency components in the spectrum of the time variation of the mode components of voltage and current.

A block schematic diagram of a power line protection system is shown is FIG. 5. Fault detectors, one of which is shown in detail at 10, are located at the terminations R and S on power line 11. A voltage sensor 12 and current sensor 13 are located at each termination for each conductor (a, b and c) of the three phase line 11. The outputs of sensors 12 and 13 are fed to voltage mixing and current circuits 15 and 16 respectively, which form the respective voltage modal components ($v_{R1}(t)$, $v_{R2}(t)$, $v_{R3}(t)$ at R) and current modal component ($i_{R1}(t)$, $i_{R2}(t)$, $i_{R3}(t)$ at R) or their input signals. The current modal components are passed through a surge replica circuit 17 to produce the product of each component and a constant R, which represents the surge impedance of the line. Modal component signals $R_{iR}(t)$ and $v_R(t)$ are then mixed by mixing circuits at 18 to provide on output pairs 19, 20 and 21, $v_R(t) - Ri_R(t)$ and $v_R(t) + Ri_R(t)$ for each mode. Each of the outputs relating to the modes 1, 2 and 3 is then processed in the same manner, but for simplicity the mode 2 channel only will be described and illustrated.

As will be seen in FIG. 5 the signals on outputs 20 are fed to respective inputs of superimposed component circuit 22, which subtracts the instantaneous values of the signals on its inputs from their steady-state value to provide signals $S_{1R2}$ and $S_{2R2}$ on its outputs 14. A sequence detector 23 detects which of $S_{1R2}$ and $S_{2R2}$ is the first to obtain a value outside the band defined by $\pm V_s$ (see FIG. 4), i.e. the first to go 'finite'. If $S_{1R2}$ is the first to go 'finite' then the fault is in a forward direction i.e. downstream of R. If $S_{2R2}$ is the first to go finite the fault is a reverse fault i.e. upstream of R.

If a forward fault is detected the sequence detector 23 generates a 'trip' output and if a reverse fault is detected a 'block' output is generated. The trip signals and block signals from the sequence detector in each mode channel are fed to respective 'trip' and 'block' OR gates 24 and 25. Thus if any of the mode channels detect a forward fault a tripping signal is produced on line 26 and if any of the mode channels detect a reverse fault a blocking signal is produced on line 27.

The tripping signal on line 26 closes a first switch 28, which is connected in series with a circuit breaker 29 connected in the line at R. A second switch 30 is connected in series with first switch 28 such that the circuit breaker 29 will not be energised unless both of switches 28 and 30 are closed. In practice switch 30 is normally closed and is opened by any blocking signal from the fault detector at S sent over communications link 31. In order to prevent false tripping of the circuit breakers 29 the tripping signal is delayed until any blocking signal from S would have been received. The blocking signals produced by fault detector at R are similarly transmitted on link 31 to an identical switching arrangement at S.

The detectors at R and S are arranged to act in opposite senses, so that if both detect a fault on the line each generates a tripping signal and the line is isolated, if a fault occurs in system R the fault detector at R will produce a blocking signal which will inhibit, the tripping signal generated at S and if a fault occurs in system S a blocking signal from S will inhibit the tripping signal at R.

It will be appreciated that alternative switching arrangements can be used and that the tripping and blocking signals can be otherwise utilized.

It will also be appreciated that instead of forming the superimposed components after the signal mixing, they could be formed prior to mixing or prior to the derivation of the modal components. Similarly the modal components could be formed after the mixing stage, although this may be more difficult in practice.

The whole arrangement is analogue based throughout and, unlike digital type equipment, does not therefore require the use of low-pass filters for conditioning the input signals prior to processing. This is of considerable importance because the group delays caused by the necessity for pre-filtering in digital schemes inevitably increases the fault clearance time.

FIG. 6a shows one channel of the superimposed components circuit 22. A signal $v_{R2}(t) - R_{o2}iR_2(t)$ is fed from mixing circuits 18 to an input 32 of circuit 22 from whence it is fed directly to the positive input of amplifier 33. The delay is arranged to delay the waveform by an integer or half integer multiple of the period $T = 1/f_o$, say 1 cycle, so that during normal functioning on the line the steady-state modal signal is effectively subtracted from itself producing a null output. However at the instant of fault as can be seen from FIG. 6b, the input signal ceases to be sinusoidal and the differential amplifier subtracts the steady-state value of the signal from the fault condition signal and continues to do so for the period of the delay. This produces a non-zero output from amplifier 33 which constitutes the fault condition superimposed component of signal $V_{R2}(t) - R_{o2}iR_2(t)$ i.e. $S_{1R2}$. An identical circuit derives $S_{2R2}$. The delay 34 is typically a charge coupled device such as a bucket brigade delay line.

FIG. 7 shows a mode channel sequence detector in detail. Signals $S_{1R2}$ and $S_{2R2}$ are fed to respective level detectors 35 and 36, each of which produces an output if its respective signal passes through either limits $\pm V_s$. The output of detector 35 is fed via an invertor 37 to one input of an AND gate 38 and directly to a further AND gate 39. The output of detector 36 is fed to the other input of AND gate 38. Thus AND gate 38 only has an output if $S_{2R2}$ but not $S_{1R2}$ is finite. This output is fed to one input of a further AND gate 40 and to a pulse generator 41. The receipt of this input causes the output of pulse generator 41 to fall to zero. As this output is fed to AND gate 39, AND gate 39 only has an output when $S_{1R2}$ but not $S_{2R2}$ is finite. A non-zero output from AND gate 39 causes the output of a further pulse generator 42 to drop to zero. The output pulse generator 42 is fed to the other input of AND gate 40 and to a trip output 43 via inverting delay 44. It can thus be seen that if $S_{1R2}$ goes finite before $S_{2R2}$ a trip output is produced, and if $S_{2R2}$ is the first to go finite a block output is generated by pulse generator 45. If both go finite simultaneously a trip output results.

In practice the outputs of pulse generator 41 and 42 fall to zero for a pre-set time $T_L$, which determines the latching time of the detector. Similarly the output from pulse generator 45 is produced for a limited period.

The time setting $T_L$ has to exceed the maximum time for which, following a fault condition, the input signals can possibly exceed threshold, and the results of tests on the prototype relay have indicated that a time equivalent to 3 cycles of power frequency (60 ms for a nominally 50 Hz system) is more than adequate.

As mentioned previously, in the event of a forward fault, the tripping signal has to be delayed by a sufficient time to enable the local blocking relay to operate on receipt of a carrier blocking signal generated by the relay at the other end of the line following an out of zone fault. The inverting delay circuit fulfils this function by delaying the trip signal by a time $T_D$.

The closure of a line circuit breaker in itself effects a disturbance which is detected by the relay but, provided the transducers are placed on the line side of the circuit breakers as shown in FIG. 5, such a disturbance is seen as emanating from outside the protected zone and unwanted tripping is thereby avoided.

If the blocking communication channel path length is comparable with the line length then the tripping time delay $T_D$ required for discrimination is a function only of the characteristics of the communication equipment and the blocking relay response time. Specifically, $T_D$ must exceed a time equal to the time for the communication equipment to respond to a blocking signal from the relay plus the time taken for the blocking relay at the other end of the line to operate on receipt of a blocking signal. The delay therefore depends on the type of communication equipment used. The use of a microwave group carrier frequency based communication system might require an overall operating time of the order of 2 ms.

FIGS. 8 and 9 show actual inputs to a sequence detector in the event of a forward fault and a reverse fault respectively.

The u.h.s. directional detector is not an impedance measuring device and is consequently not subject to the limitations of conventional distance protective gear in respect of very high resistance single phase to earth faults such as those involving flashover to vegetation. Nevertheless, in the case of high resistance faults the superimposed voltage at the fault point, which in turn gives rise to superimposed components from which measurements are made at the relaying points, is injected through a relatively high resistance. Ultimately, a condition is reached where the fault resistance is so high that the resulting superimposed components at the relaying points lie below the relay setting. The line R-S of a test configuration was subjected to high resistance faults on the "a" phase to ascertain the performances of the relay, and FIG. 10 summarises the results. It can be seen that the maximum tolerable fault resistance varies considerably. For example, the relay at end S is seen to operate for fault point resistance in the range of less than approximately 40Ω to 550Ω according to the fault position and the point-on-wave at which the fault occurs. The limiting fault resistance for which the relay at S will respond following a fault at maximum voltage is approximately 100Ω.

The performance in respect of very high resistance faults is generally rather superior to that of conventional distance type measuring devices. This is mainly because the new device is essentially load independent by virtue of the fact that the measuring process only involves superimposed components which effectively propagate according to the characteristics of a given system when in the de-energised state, i.e., they are not a function of the pre-fault load on the circuit.

I claim:

1. A method of determining the direction of a fault on an electrical conductor from a monitoring position along the length of the conductor comprising: forming first and second signals $S_{1R}$ and $S_{2R}$ of the form:

$$S_{1R} = K_1 V_f(t) - K_2 R i_R(t)$$

$$S_{2R} = K_3 V_f(t) + K_4 R i_R(t)$$

where
   $V_f(t)$ is a signal proportional to the difference between the steady-state voltage and the instantaneous voltage on the conductor at the monitoring position;
   $R i_R(t)$ is a signal proportional to the product of the difference between the steady-state current and the instantaneous current on the conductor at the monitoring position and a constant (R) which is related to the surge impedance of the conductor; and each of
$K_1, K_2, K_3$ and $K_4$ is a positive or negative constant; and determining the sequence in which the signals $S_{1R}$ and $S_{2R}$ vary from selected values, and thereby the direction of the fault.

2. A method according to claim 1 wherein the direction of the fault is determined by determining which of the signals $S_{1R}$ and $S_{2R}$ first varies from the relevant selected value.

3. A method according to claim 1 wherein the direction of the fault is determined by determining the sequence in which the signals $S_{1R}$ and $S_{2R}$ become finite.

4. A method according to claim 3 wherein a signal $S_{1R}$ or $S_{2R}$ is taken to be finite when it exceeds a predetermined setting level.

5. A method according to claim 1 wherein the signals $S_{1R}$ and $S_{2R}$ are formed from modal components of the conductor voltage and current.

6. A method of determining the direction of a fault in a polyphase alternating current electric power supply system wherein the direction of a fault on each phase conductor of the system is individually determined by a method according to claim 5.

7. Apparatus for determining the direction of a fault on an electrical conductor from a monitoring position along the length of the conductor comprising: means for forming first and second signals $S_{1R}$ and $S_{2R}$ of the form:

$$S_{1R} = K_1 V_f(t) - K_2 R i_R(t)$$

$$S_{2R} = K_3 V_f(t) + K_4 R i_R(t)$$

where
   $V_f(t)$ is a signal proportional to the difference between the steady-state voltage and the instantaneous voltage on the conductor at the monitoring position;
   $R i_R(t)$ is a signal proportional to the product of the difference between the steady-state current and the instantaneous current on the conductor at the monitoring position and a constant (R) which is related to the surge impedance of the conductor; and each of
$K_1, K_2, K_3$ and $K_4$ is a positive or negative constant; and sequence detector means for determining the sequence in which the signals $S_{1R}$ and $S_{2R}$ vary from selected values.

8. Apparatus according to claim 7 wherein said detector means determines which of the signals $S_{1R}$ and $S_{2R}$ first varies from the relevant selected value.

9. Apparatus according to claim 7 wherein said detector means determines the sequence in which the signals $S_{1R}$ and $S_{2R}$ become finite.

10. Apparatus according to claim 9 wherein a signal $S_{1R}$ or $S_{2R}$ is taken to be finite when it exceeds a predetermined setting level.

11. Apparatus according to claim 7 wherein the means for forming the signals $S_{1R}$ and $S_{2R}$ comprises: means for sensing the voltage and current on the conductor; means for forming modal components of the conductor voltage and current; and means for utilizing said voltage and current modal components and a replica impedance representative of the surge impedance of the conductor to form said signals $S_{1R}$ and $S_{2R}$.

12. Apparatus for determining the direction of a fault in a polyphase electric power transmission line comprising an individual apparatus according to claim 11 for determining the direction of a fault on each phase conductor of the system.

13. Apparatus according to claim 7 for determining the direction of a fault in an alternating current electric power supply system wherein said means for forming said signals $S_{1R}$ and $S_{2R}$ incorporates means for producing an output signal representative of the difference between the steady state and instantaneous values of an input signal comprising: subtracting means having first and second inputs; means for applying said input signal to one input of the subtracting means; a delay means; and means for applying said input signal to the second input of the subtracting means via said delay means, the delay means providing a delay which is an integral multiple of half the period of the alternating current waveform.

14. Apparatus according to claim 13 wherein said delay means comprises a charge-coupled device.

15. A power line protection system comprising: an apparatus for determining the direction of a fault according to claim 7 at each end of a section of power line to be protected; switching apparatus for protecting said line section in the event of a fault; and decision means responsive to the outputs of both said fault direction determining apparatuses to determine whether a fault has occurred within or without said line section, and to activate said switching apparatus accordingly.

16. A system according to claim 15 wherein said decision means activates said switching apparatus only when both said fault determining direction apparatuses detect a fault in a direction looking into said line section.

* * * * *